(12) United States Patent
Yang et al.

(10) Patent No.: US 7,536,631 B1
(45) Date of Patent: May 19, 2009

(54) ADVANCED COMMUNICATION APPARATUS AND METHOD FOR VERIFIED COMMUNICATION

(75) Inventors: Brian Hang Wai Yang, San Jose, CA (US); Kai-Yeung Siu, San Jose, CA (US); Mizanur M. Rahman, Cupertino, CA (US); Ken Yeung, San Jose, CA (US); Hsi-Tung Huang, Milpitas, CA (US)

(73) Assignee: RMI Corporation, Cupertino, CA (US)

( * ) Notice: Subject to any disclaimer, the term of this patent is extended or adjusted under 35 U.S.C. 154(b) by 843 days.

(21) Appl. No.: 10/452,229

(22) Filed: Jun. 3, 2003

Related U.S. Application Data

(60) Provisional application No. 60/435,120, filed on Dec. 19, 2002.

(51) Int. Cl.
  *G06F 11/08* (2006.01)
  *H03M 13/00* (2006.01)
  *H04L 1/00* (2006.01)
(52) U.S. Cl. .................. 714/797; 714/757; 714/747
(58) Field of Classification Search .............. 714/797, 714/757, 747
  See application file for complete search history.

(56) References Cited

U.S. PATENT DOCUMENTS 3,665,173 A * 5/1972 Bouricius et al. ............. 714/11
4,519,079 A * 5/1985 Hamer ....................... 714/702

\* cited by examiner

*Primary Examiner*—Joseph D Torres
(74) *Attorney, Agent, or Firm*—Zilka-Kotab, PC

(57) ABSTRACT

A communication circuit for verified communication comprising a transmitter having input terminals to receive a data word, an encoder configured to encode the data word to create an encoded word different from the data word, and output terminals configured to transmit the data word and the encoded word. A receiver is coupled to the transmitter and includes input terminals to receive the data word as a received word and the encoded word, a decoder configured to decode the encoded word to create a decoded word, and a comparator configured to compare the received word and the decoded word to create a select signal, and a selector responsive to the select signal and configured to select the received data word or the decoded word based at least in part on the select signal. Advantages of the invention include the ability to verify redundant received data without decreasing bandwidth or increasing latency.

12 Claims, 5 Drawing Sheets

ADVANCED COMMUNICATION APPARATUS AND METHOD FOR VERIFIED COMMUNICATION

REFERENCE TO RELATED APPLICATIONS

This application claims priority to U.S. Provisional Application No. 60/435,120, filed Dec. 19, 2002, incorporated herein by reference.

FIELD

The present invention relates to the field of telecommunications, and more particularly to an advanced apparatus and method for verified communication between a transmitter and receiver.

BACKGROUND

Digital broadband networking and communications products and services are the infrastructure over which the Internet operates. The universal benefits of the Internet are now quite well known, enabling immediate worldwide sharing of news and events, access to in-depth research on virtually any topic, sophisticated financial analysis available to all, the convenience of e-commerce available on virtually any product to consumers and the emerging capabilities for commercial e-commerce, and the outsourcing enabled by Application Service Providers and Storage Area Networks, to list just a few of the world-changing available uses.

This explosive growth in network traffic is further demonstrated by forecasts made by many leading networking industry experts regarding scaling specific infrastructure areas. Every aspect of these scaling estimates represents requirements for network equipment to scale to provide the necessary bandwidth. However, network traffic is susceptible to channel distortion. Often created by inherent networking equipment limitations, or by ambient electromagnetic fields, distortion can create bit errors within each transmitted data word. In a common bit error verification technique, each data word contains a checksum verifying the data in the transmission word. A transmitter then transmits the word, which is inspected by the receiver. If the checksum matches the arriving data word, the receiver presumes that the complete transmission was received, and a verified word is forwarded on to its destination. However, this process of performing checksum computation can also increase network latency since the transmitted word must be temporarily stored and verified in a memory buffer. In another possible solution, bandwidth is minimized to the greatest possible extent. In general, decreasing the amount of spectrum occupied by a signal also decreases the amount of transmitted noise. Reducing the bandwidth, however, can also increase the latency, since a greater amount of data may need to be buffered prior to being delivered to the receiving application.

To facilitate the description, FIG. 1 shows a simplified functional diagram of a common multilink communications channel. In general, a channel is a separate path along which a data word can be transmitted. Each channel further comprises a set of links through which individual data bits can simultaneously flow, and in some instances, the links can be redundant links. Channel 106 comprises N number of links 104 and is coupled to a transmitter 102 and a receiver 108. For example, in a redundant two-link communications channel, two identical words would be transmitted from transmitter 102 across channel 106 to receiver 108. The receiver contains a store and forward buffer 110, for temporarily storing and evaluating the received words. These words are subsequently forwarded on to the appropriate destination, before the next set of words is transmitted. If one of the words is deemed to be invalid, the valid word is the one that is forwarded. This redundant technique works well, but does not overcome the limitations of bandwidth and latency described above.

What are needed is both a method and an apparatus for verifying the transmission of a set of data bits from a transmitter to a receiver, without decreasing bandwidth or increasing latency.

SUMMARY OF INVENTION

The invention relates, in one embodiment, to an apparatus for providing verified communication, comprising a transmitter including input terminals to receive a data word, an encoder configured to encode the data word to create an encoded word different from the data word, and output terminals configured to transmit the data word and the encoded word. The apparatus also includes a receiver coupled to the transmitter and including input terminals to receive the data word as a received word and the encoded word, a decoder configured to decode the encoded word to create a decoded word, and a comparator configured to compare the received word and the decoded word to create a select signal, and a selector responsive to the select signal and configured to select the received data word or the decoded word based at least in part on the select signal.

In another embodiment, the invention relates to a method for providing verified communication between a transmitter and a receiver. The method includes receiving a data word in the transmitter, encoding the data word to create an encoded word different from the data word, and transmitting the data word and the encoded word from the transmitter to the receiver. The method further includes receiving the data word as a received word and the encoded word in the receiver, decoding the encoded word to create a decoded word, comparing the received word and the decoded word and creating a select signal, and selecting the received data word or the decoded word based at least in part on the select signal.

Advantages of the invention include the ability to verify the transmission of a set of data bits from a transmitter to a receiver, without decreasing bandwidth or increasing latency. Additional advantages of the invention include optimizing network reliability by enabling a redundant communications channel.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

The invention is described with reference to specific architectures and protocols. Those skilled in the art will recognize that the description is for illustration and to provide the best mode of practicing the invention. The description is not meant to be limiting. For example, reference is made to two channels and six links, but any number of channels and links can be used. Furthermore, the term word is used in its generic sense, as a unit of data that is routed between an origin and a destination. It can apply to both Internet traffic, as well as traffic on other word-switched networks.

In accordance with one embodiment of the present invention, an alternative channel is advantageously employed to facilitate the verification of a transmitted data word without decreasing bandwidth or increasing latency. Instead of sequentially transmitting an identical redundant word along the same channel, as in the prior art, a verification word is transmitted along an alternative channel.

In general, the probability of a single bit error is much greater than a multi-bit error in any transmitted word. A verification word is created that includes a logical bitwise combination of the bits in the transmitted word. By transmitting this verification word along an alternative channel, the receiver can quickly detect corruption without the need for a store and forward buffer. In one embodiment, the logical bitwise combination includes a series of XOR operations.

Figure 1:
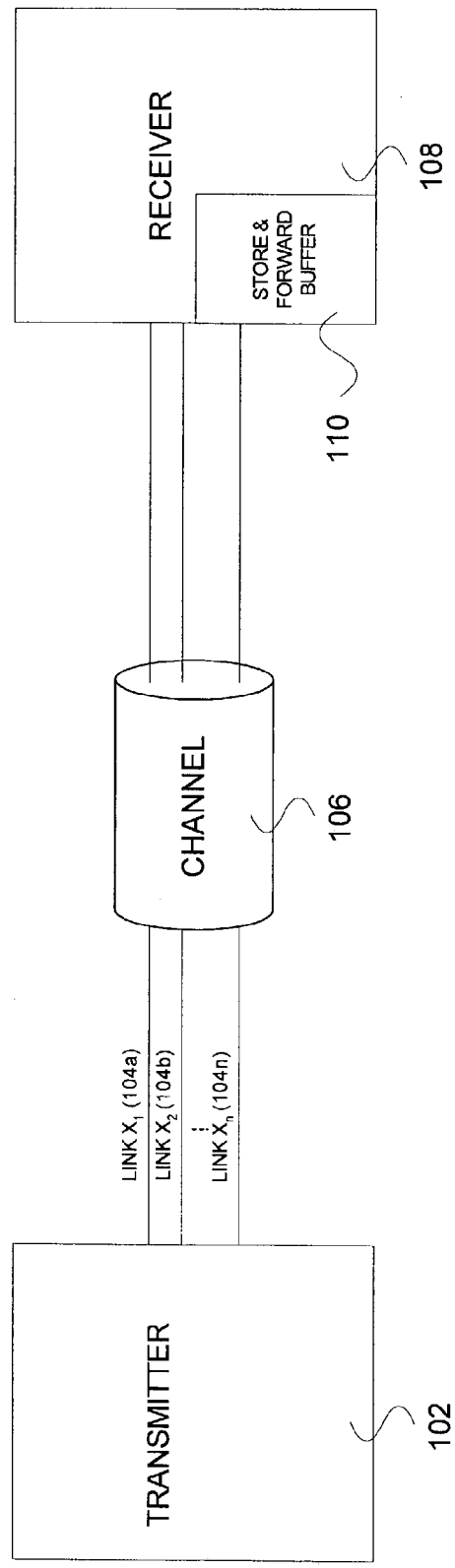
FIG. 1 depicts a simplified functional diagram of a common multilink communications channel.
Figure 2:
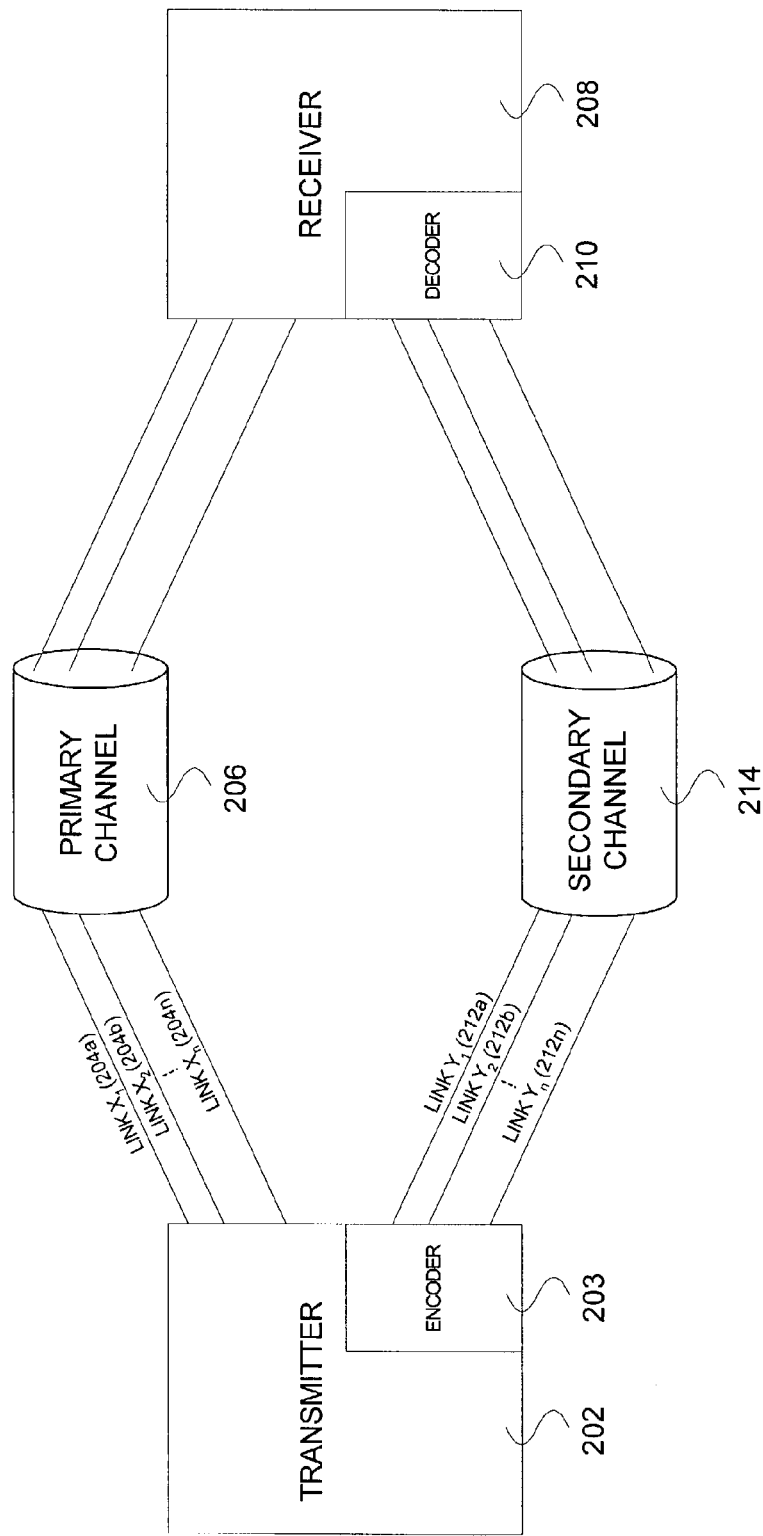
FIG. 2 illustrates a simplified functional diagram is illustrated of a multi-channel communication architecture, according to an embodiment of the invention.

Referring now to FIG. 2, a simplified functional diagram is illustrated of multi-channel communication architecture, according to an embodiment of the invention. Primary channel 206 is the primary communications channel for the primary data word, and further comprises a set of links 204 through which the individual primary data bits can simultaneously flow. Primary channel 206 is further coupled to a transmitter 202 and a receiver 208.

Secondary channel 214 comprises a redundant communications channel for the transmission of a verification word. Like primary channel 206, secondary channel 214 further comprises a set of links 212, through which the individual verification data bits can simultaneously flow. Secondary channel 214 is further coupled a transmitter 202 through an encoder module 203, and to receiver 208 through a decoder module 210.

For example, for the transmission of a data word comprising three bits along a primary channel 206, a verification word also with three bits would be sent along secondary channel 214, in a substantially simultaneous fashion. The verification bits are then subsequently decoded at the receiver and converted to an alternate set of data bits, which are then compared to the original received data bits. If no error is detected, all the original transmitted data bits are forwarded on to the appropriate application. If a single bit error occurs, a comparator in the receiver determines on which channel the error occurred. If the error occurred in the primary channel 206, the alternative data bits are selected to forward on to the appropriate application. If the error occurred in the secondary channel 214, the primary data bits are selected to forward on to the appropriate application. Should a multi-bit error occur, the receiver requests that the data word be re-sent by the transmitter.

Figure 3:
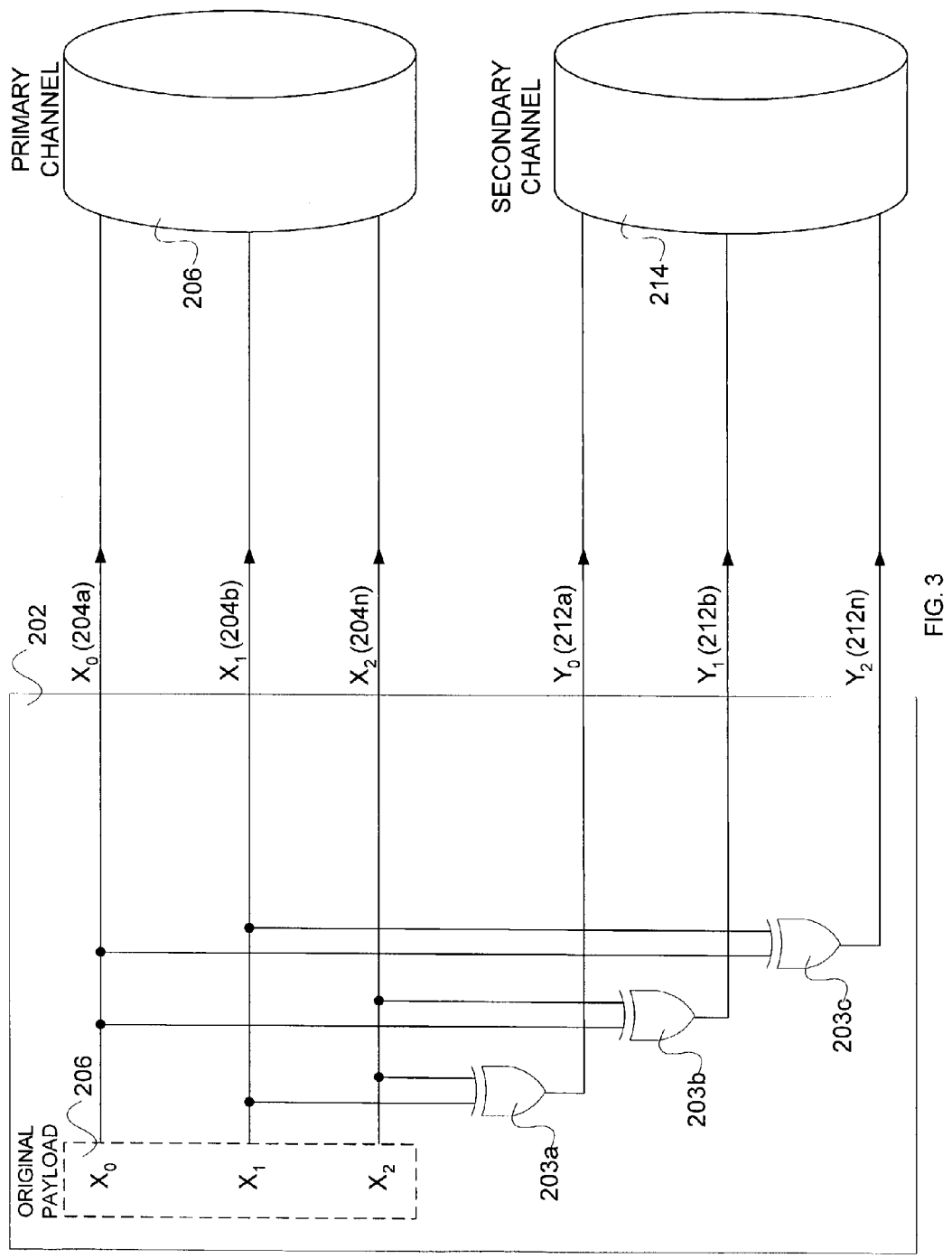
FIG. 3 illustrates a more detailed functional diagram of a transmitter according to an embodiment of the invention.

Referring now to FIG. 3, a more detailed functional diagram of transmitter 202 as shown in FIG. 2 is illustrated, according to an embodiment of the invention. In this example a primary word comprising three primary data bits $X_0$-$X_2$ is transmitted by primary channel 206. $X_0$ is transmitted through link 204$a$. $X_1$ is transmitted through link 204$b$. And $X_2$ is transmitted through link 204$n$. A verification word, comprising verification bits $Y_0$-$Y_2$, is further created in a series of logical XOR operations 203 of the set of transmitted primary data bits.

| ENCODER INPUT (Transmitted Primary Data Bits) | ENCODER OUTPUT (Transmitted Verification Bits) |
|---|---|
| $X_1$ XOR $X_2$ | $Y_0$ |
| $X_0$ XOR $X_2$ | $Y_1$ |
| $X_0$ XOR $X_1$ | $Y_2$ |

$Y_0$ is transmitted through link 212$a$. $Y_1$ is transmitted through link 212$b$. And $Y_2$ is transmitted through link 212$n$.

Figure 4:
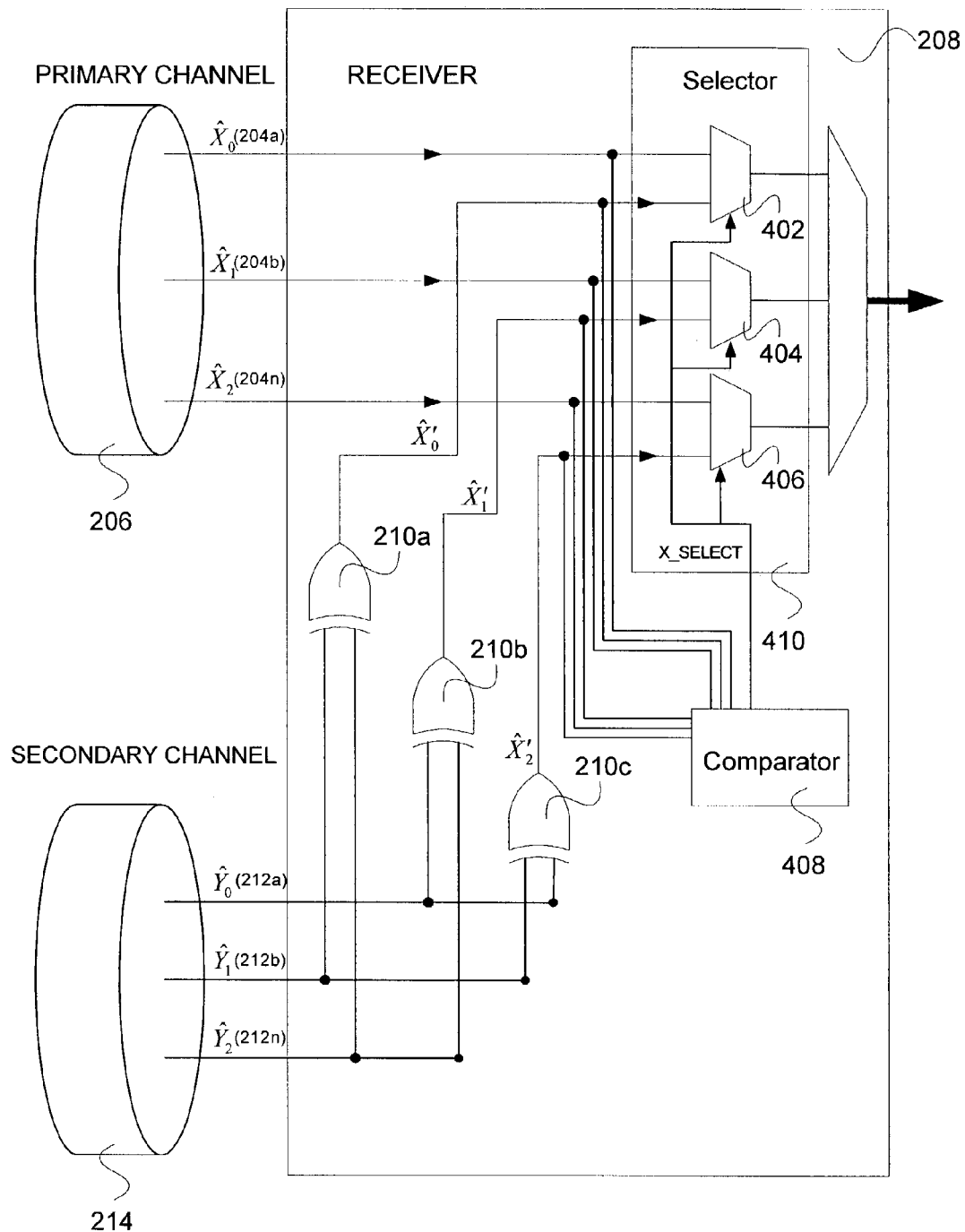
FIG. 4 illustrates a more detailed functional diagram of a receiver according to an embodiment of the invention; and, FIG. 5 illustrates the detailed functional diagram of FIG. 4 with the addition of signal detect functionality, according to an embodiment of the invention.

Referring now to FIG. 4, a more detailed functional diagram of receiver 208 as shown in FIG. 2 is illustrated, according to an embodiment of the invention. In this example, the primary word 204 of FIG. 3, comprised of received data bits $\hat{X}_0$-$\hat{X}_2$ is received on primary channel 206, while the verification word 212 of FIG. 3, comprised of received verification bits $\hat{Y}_0$-$\hat{Y}_1$, is received on secondary channel 214. The "^" symbol is used to denote that the received bits may be different than the transmitted bits, perhaps due to an error. $\hat{X}_0$ is transmitted through link 204$a$, $\hat{X}_1$ is transmitted through link 204$b$, and $\hat{X}_2$ is transmitted through link 204$n$. Likewise, $\hat{Y}_0$ is received through link 212$a$, $\hat{Y}_1$ is received through link 212$b$, and $\hat{Y}_2$ is received through link 212$n$. Verification bits $\hat{Y}_0$-$\hat{Y}_2$ are further decoded by module 210, in a series of logical XOR operations, to create an alternate word comprised of a word of received decoded data bits, $\hat{X}_0'$-$\hat{X}_2'$.

| DECODER INPUT (Received Verification Bits) | DECODER OUTPUT (Decoded Data Bits) |
|---|---|
| $\hat{Y}_1$ XOR $\hat{Y}_2$ | $\hat{X}_0'$ |
| $\hat{Y}_0$ XOR $\hat{Y}_2$ | $\hat{X}_1'$ |
| $\hat{Y}_0$ XOR $\hat{Y}_1$ | $\hat{X}_2'$ |

Comparator 408 includes a comparison circuit and provides a select signal to selector 410. The comparator compares the data bit on each link of the primary word to the corresponding data bit on each link of the alternative word, determines if there is an error, and further attempts to select the correct received data bit in the pair. Based on this information, it provides the select signal to the selector in order to select the valid data.

Verification bits are initially created in a series of logical XOR operations of the set of transmitted primary data bits. In order to generate received alternate data bits, the reverse operation is performed. Subsequently, a single bit error in one verification bit would subsequently cause bit errors in all the received alternate data bits derived from it. Therefore, if only one pair is determined to be unequal, the bit error could not have occurred in the verification bit, but rather in a primary data bit.

Likewise, if all but one pair contains a bit error, then the bit error must have occurred in a verification bit in the secondary channel, and the data bits received through the primary channel are chosen as correct. If all pairs are equal, then either channel may be chosen. In any other case, however, a multiple bit error occurred, in which are transmission of the word is performed.

The comparator is configured to compare the bits in the received word with those in the decided word and to select the valid bits in each word to recreate the data word. In one aspect, the comparator is configured to compare the bits in the received word with those in the decided word and to select the valid bits in each word to recreate the data word according to the following rules: (a) when there is no difference between the received word and the decoded word, then both words are correct; (b) when there is a single bit difference between the received word and the decoded word, then the decoded word is correct; (c) when there is an n−1 bit difference (where n is the number of bits in the data word) between the received word and the decoded word, then the received word is correct; and (d) when neither (a) or (b) or (c) is true, discarding the word as invalid.

For example, a transmission of the bits $X_0$, $X_1$, and $X_2$, comprises a single bit error in which $\hat{X}_0 \neq \hat{X}_0'$. Since there are two separate channels, the bit error occurred in either $\hat{X}_0$ as it was transmitted in the primary channel, or in $\hat{X}_0'$ as it was transmitted in the secondary channel. $\hat{X}_0'$, however, is created by the XOR of the transmitted verification bits $\hat{Y}_1$ and $\hat{Y}_2$. As previously described, an error in a verification bit will affect the alternate data bits that are derived from it. Therefore, since only one pair is incorrect, the error occurred in the primary channel, and the word transmitted through the secondary channel is selected as correct.

In a second example, if $\hat{X}_0 \neq \hat{X}_0'$, and $\hat{X}_1 \neq \hat{X}_1'$, but $\hat{X}_2 = \hat{X}_2'$, the bit error occurred in the $\hat{Y}_2$ verification bit that is used to derive both $\hat{X}_0'$ and $\hat{X}_1'$. Therefore, the error occurred in the secondary channel, and the word transmitted through the primary channel is selected as correct.

In a third example, if $\hat{X}_0 \neq \hat{X}_0'$, $\hat{X}_1 \neq \hat{X}_1'$, and $\hat{X}_2 \neq \hat{X}_2'$, a multi-bit error occurred. In this case, since the error cannot be resolved, the system would retransmit the data word.

Figure 5:
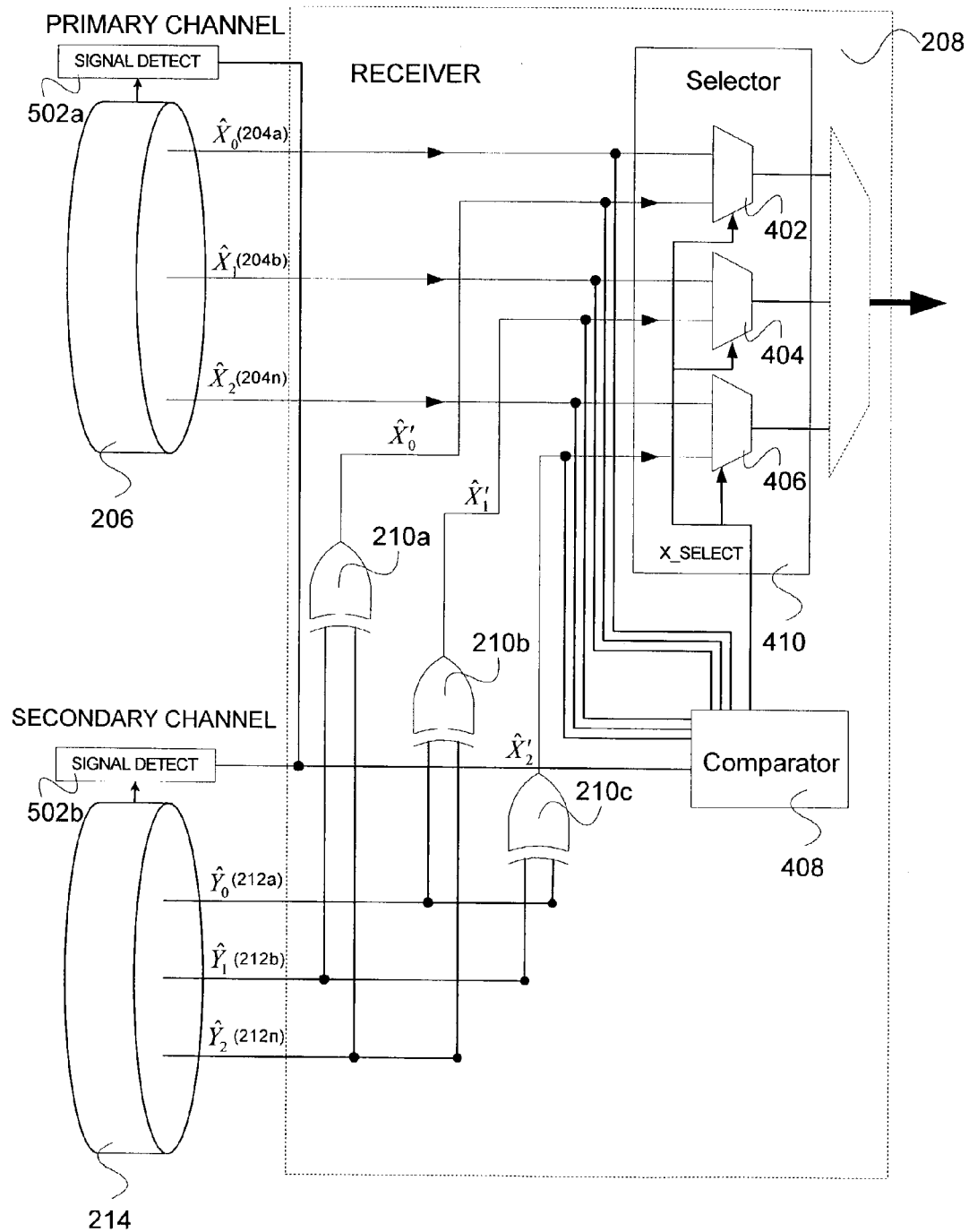

Referring now to FIG. 5, which depicts an embodiment similar to the detailed functional diagram of FIG. 4 with the addition of signal detect functionality. Modern networks are often composed of heterogeneous equipment residing across multiple geographic domains. Because it is generally not practical or even economical to control every intermediate component, end-to-end channel reliability is difficult to maintain. Channel outages caused by unplugged, defective, misconfigured, malfunctioning, or even destroyed components are not uncommon.

In addition to providing efficient data verification, the current invention enables a multiple verification channel implementation to further increase channel redundancy. That is, should any individual channel be down, the remaining channels can still be available to transport and verify the data. In a two-channel implementation, should one channel be down, the current invention enables the data link to still be maintained through the remaining channel, although data verification capability may be temporarily suspended until the malfunctioning channel is online again. In other words, the invention will disregard the failed channel and select the remaining channel. However, other types of network verification mechanisms, such as in TCP-IP, may still be available to insure data integrity. In this example, signal detect 502 notifies comparator 408 if either primary channel 206 or secondary channel 214 is down. Should one channel not be available, comparator 408 directs selector 410 to choose the active channel for communication.

Advantages of the invention include the ability to verify the transmission of a set of data bits from a transmitter to a receiver, without decreasing bandwidth or increasing latency. Additional advantages of the invention include optimizing network reliability by enabling a redundant communications channel.

While this invention has been described in terms of several preferred embodiments, there are alterations, permutations, and equivalents which fall within the scope of this invention. For example, reference is made to two channels and six links, but any number of channels and links can be used. Furthermore, the term word is used in its generic sense, as a unit of data that is routed between an origin and a destination. It can apply to both Internet traffic, as well as other network traffic. Having disclosed exemplary embodiments and the best mode, modifications and variations may be made to the disclosed embodiments while remaining within the subject and spirit of the invention as defined by the following claims.

The invention claimed is:

1. An apparatus for providing verified communication, comprising:
   a transmitter including: input terminals to receive a data word, an encoder configured to encode the data word to create an encoded word different from the data word, and output terminals configured to transmit the data word and the encoded word; and,
   a receiver coupled to the transmitter and including: input terminals to receive the data word as a received word and the encoded word, a decoder configured to decode the encoded word to create a decoded word, and a comparator configured to compare the received word and the decoded word to create a select signal, and a selector responsive to the select signal and configured to select the received data word or the decoded word based at least in part on the select signal;
   wherein the transmitter is configured to simultaneously transmit the data word and the encoded word; and
   wherein the receiver is configured to simultaneously receive the data word and the encoded word;
   a first signal detector coupled to a first communications channel including a set of received words;
   a second signal detector coupled to a second communications channel including a set of the encoded words;
   wherein, if the first communications channel is not available, the first signal detector notifies the comparator which instructs the selector to choose the set of encoded words from the second communications channel; and,
   wherein, if the second communications channel is not available, the second signal detector notifies the comparator which instructs the selector to choose the set of received words from the first communications channel.

2. The apparatus of claim 1, wherein:
   the encoder is configured to create the encoded word having the same number of bits as the data word.

3. The apparatus of claim 1, wherein:
   the encoder is configured, for each bit of the data word, to Exclusively OR (XOR) the other bits of the data word to create the encoded word.

4. The apparatus of claim 3, wherein:
   the decoder is configured, for each bit of the encoded word, to Exclusively OR (XOR) the other bits of the encoded word to create the decoded word.

5. The apparatus of claim 4, wherein:
   the comparator is configured to compare the bits in the received word with those in the decoded word and to select the valid bits in each word to recreate the data word.

6. The apparatus of claim 1, wherein:
   the decoder is configured, for each bit of the encoded word, to Exclusively OR (XOR) the other bits of the encoded word to create the decoded word.

7. The apparatus of claim 1, wherein:

the comparator is configured to compare the bits in the received word with those in the decoded word and to select the valid bits in each word to recreate the data word.

8. The apparatus of claim 1, wherein:

the comparator is configured to compare the bits in the received word with those in the decoded word and to instruct the selector to choose the valid bits in each word to recreate the data word according to the following rules:

(a) when there is no difference between the received word and the decoded word, then both words are correct;

(b) when there is a single bit difference between the received word and the decoded word, then the decoded word is correct;

(c) when there is an n−1 bit difference (where n is the number of bits in the data word) between the received word and the decoded word, then the received word is correct; and, (d) when neither (a) or (b) or (c) is true, discarding the word as invalid.

9. The apparatus of claim 1, wherein the receiver is coupled to the transmitter using a primary channel.

10. The apparatus of claim 9, wherein the primary channel is the primary communications channel for the data word.

11. The apparatus of claim 10, wherein a secondary channel is coupled to the transmitter through the encoder, and further coupled to the receiver through the decoder.

12. The apparatus of claim 11, wherein the secondary channel comprises a redundant communications channel for transmission of the encoded word.

\* \* \* \* \*